United States Patent [19]

Jacob

[11] Patent Number: 4,659,983
[45] Date of Patent: Apr. 21, 1987

[54] METHOD AND APPARATUS FOR DETECTING A SHORTED SCR

[75] Inventor: Paravila O. Jacob, Sterling Heights, Mich.

[73] Assignee: General Motors Corporation, Detroit, Mich.

[21] Appl. No.: 780,990

[22] Filed: Sep. 27, 1985

[51] Int. Cl.⁴ .................................................. G01R 31/02
[52] U.S. Cl. ........................................ 324/51; 324/57 Q; 324/59; 324/158 SC
[58] Field of Search .................. 324/57 R, 57 Q, 59, 324/51, 52, 158 SC; 340/635, 645, 650; 219/10.75, 10.77

[56] References Cited

U.S. PATENT DOCUMENTS

| | | | |
|---|---|---|---|
| 4,112,286 | 9/1978 | Alderman et al. | 219/10.77 X |
| 4,114,010 | 9/1978 | Lewis | 219/10.77 X |
| 4,384,248 | 5/1983 | Matsuda et al. | 324/51 |

OTHER PUBLICATIONS

Blackwell et al., "Measuring Small Inductances", *Wireless World*, Feb. 1944, pp. 37–40.

*Primary Examiner*—Reinhard J. Eisenzopf
*Assistant Examiner*—Stephen M. Baker
*Attorney, Agent, or Firm*—Warren D. Hill

[57] ABSTRACT

The inductors in an induction heating apparatus are arranged in parallel branches with an SCR in series with each inductor and an RC snubber circuit in parallel with each inductor. If an SCR becomes shorted the faulty SCR is detected by a method and apparatus for coupling a capacitor across the inductors one at a time, exciting the capacitor-inductor circuit with a frequency suitable to induce a resonant condition provided the inductor is in series with a normal SCR and whereby resonance will not occur if the inductor is in series with a shorted SCR, and sensing circuit resonance thereby detecting whether the SCR in series with the selected inductor is shorted.

1 Claim, 1 Drawing Figure

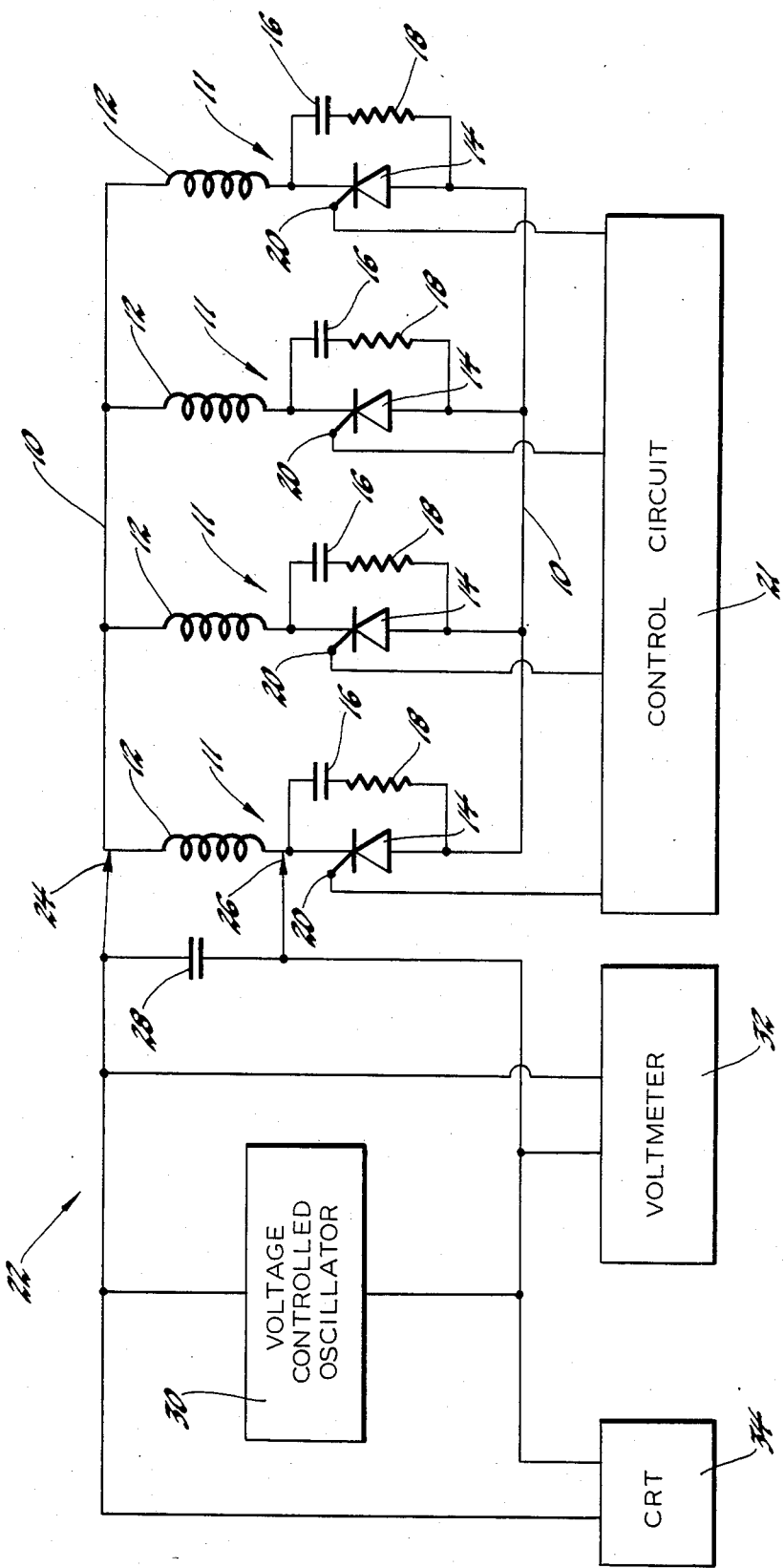

4,659,983

METHOD AND APPARATUS FOR DETECTING A SHORTED SCR

FIELD OF THE INVENTION

This invention relates to a method and apparatus for detecting a shorted silicon controlled rectifier (SCR) in a circuit containing several SCRs.

BACKGROUND OF THE INVENTION

In an induction heating inverter there may be many parallel current carrying paths each containing an SCR in series with an inductor. When any SCR becomes shorted the entire parallel circuit appears to be shorted. The standard procedure for identifying the failed SCR has been to disconnect the SCRs from the circuit one by one for individual testing. This procedure is time consuming and it allows opportunity for damage to the SCRs and other circuit components.

SUMMARY OF THE INVENTION

It is therefore an object of the invention to provide a method for quickly detecting individual shorted SCRs in a circuit without circuit disassembly.

It is a further object of the invention to provide an apparatus for quickly detecting individual shorted SCRs in a circuit without circuit disassembly.

The method of the invention is carried out by detecting a shorted SCR in a circuit comprising a plurality of parallel branches, each branch containing an inductor in series with an SCR and a snubber circuit in parallel with the SCR, the method comprising coupling a capacitor across the inductors one at a time, exciting the capacitor-inductor circuit with a frequency suitable to induce a resonant condition provided the inductor is in series with a normal SCR and whereby resonance will not occur if the inductor is in series with a shorted SCR, and sensing circuit resonance thereby detecting whether the SCR in series with the selected inductor is shorted.

The invention is further carried out by apparatus for detecting a shorted SCR in a circuit comprising a plurality of parallel branches, each branch containing an inductor in series with an SCR and a snubber circuit in parallel with the SCR, the apparatus comprising; a pair of terminals for selective coupling across individual inductors, a capacitor connected across the terminals for forming a resonant circuit when coupled to an inductor, an oscillator connected across the capacitor to excite a resonant condition in a selected inductor provided the inductor is in series with a normal conductor and whereby resonance will not occur if the inductor is in series with a shorted SCR, and means coupled to the capacitor for sensing circuit resonance thereby detecting whether the series connected SCR is shorted.

BRIEF DESCRIPTION OF THE DRAWINGS

The above and other advantages of the invention will become more apparent from the following description taken in conjunction with the accompanying drawing which is a schematic diagram of a circuit to be tested and the test apparatus according to the invention.

DESCRIPTION OF THE PREFERRED EMBODIMENT

In an induction heating inverter there are typically many parallel current carrying paths connecting two input power lines 10. As shown in the figure, each parallel branch 11 comprises an inductor 12 in series with a silicon controlled rectifier (SCR) 14. A snubber circuit comprising a snubber capacitor 16 and a snubber resistor 18 in series is coupled across each SCR. Each SCR 14 has a control terminal 20 for coupling to a control circuit 21. Each of the inductors 12 has a very low resistance, much less than one ohm. The snubber capacitor 16 has a value of 0.25 microfarads, for example, and the resistor 18 is on the order of 10 ohms. The purpose of the snubber circuit is to protect the SCRs from energy spikes at the time of SCR turn-off.

In the event of a failure of an SCR which results in a short, there is nearly no resistance across the input lines 10. The good SCRs are essentially shorted also due to the low resistance of the inductors. Thus to test the SCRs in the conventional manner with an ohmmeter each one must be disconnected from the circuit to obtain a reading of its resistance.

The test apparatus 22 according to this invention has a first terminal 24 for connection to the input line joining an end of each inductor 12 and a second terminal 26 for contact with each of the other ends of the inductors 12. A capacitor 28 and an oscillator 30 are coupled across the terminals 24 and 26. The capacitor value and the oscillator frequency are chosen to create a resonant condition when coupled across one of the inductors 12. Conveniently a voltage controlled oscillator is employed. An indicator in the form of a voltmeter 32 or a cathode ray tube 34 or both are connected across the terminals 24 and 26 to determine whether a high voltage is present to indicate a resonant condition.

In use, when the associated SCR is good the resonant circuit includes not only the selected inductor but also the associated snubber circuit and the other parallel branches. The oscillator frequency is set to the resonant frequency for this circuit condition. If the SCR is shorted, the associated snubber circuit is shorted to shift the resonant frequency from that supplied by the oscillator 30. This event will be revealed by a low voltage indication on the voltmeter 32, or the CRT 34. The SCR control circuit 21 and the input lines 10 are not energized during the test. The test is quickly carried out by attaching the terminal 24 to the line 10 that is common to all the inductors 12 and briefly touching the terminal 26 to each of the opposite ends of the inductors 12 while observing the voltmeter 32 or the CRT 34 to detect a low voltage representative of a shorted SCR.

In practice, when applied to a circuit using inductors 12 having an inductance of 7.6 microhenries, a capacitor 28 of 0.15 microfarads capacitance yielded a resonant frequency of 9.8 KHz. The peak output was 1.98 volts in the case of a good SCR while an output of only 0.35 volts was obtained with a shorted SCR in series with the inductor under test.

It will be apparent that this invention provides an inexpensive test instrument which is easy to use as well as a test method that allows SCR tests to be made quickly and accurately without requiring any unnecessary disconnections of circuits components.

The embodiments of the invention for which an exclusive property or privilege is claimed are defined as follows:

1. A method for detecting a shorted SCR in a circuit comprising a plurality of parallel branches, each branch containing an inductor in series with an SCR and a snubber circuit in parallel with the SCR, the method comprising the steps of;

coupling a capacitor across the inductors one at a time, exciting the capacitor-inductor circuit with a frequency suitable to induce a resonant condition provided the inductor is in series with a normal SCR and whereby resonance will not occur if the inductor is in series with a shorted SCR, and sensing circuit resonance thereby detecting whether the SCR in series with the selected inductor is shorted.

* * * * *